United States Patent
Lee et al.

(10) Patent No.: US 6,265,913 B1
(45) Date of Patent: Jul. 24, 2001

(54) LOAD DRIVING CIRCUITS HAVING ADJUSTABLE OUTPUT DRIVE CAPABILITY

(75) Inventors: Dong-yun Lee, Kyungki-do; Seung-wook Lee; Wen-Chun Kim, both of Seoul, all of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/387,095

(22) Filed: Sep. 1, 1999

(30) Foreign Application Priority Data

Sep. 3, 1998 (KR) .................................................. 98-36292

(51) Int. Cl.[7] ................................. H03B 1/00; H03K 3/00
(52) U.S. Cl. .......................... 327/108; 327/112; 327/170; 326/87; 330/85
(58) Field of Search ............................ 327/108–112, 170, 327/384, 391–393; 326/87; 330/85

(56) References Cited

U.S. PATENT DOCUMENTS

| | | | |
|---|---|---|---|
| 4,779,013 | * 10/1988 | Tanaka | 326/87 |
| 4,825,099 | 4/1989 | Barton | 326/86 |
| 4,829,199 | * 5/1989 | Prater | 326/87 |
| 4,983,860 | 1/1991 | Yim et al. | 326/87 |
| 5,015,880 | * 5/1991 | Drake et al. | 326/87 |
| 5,028,818 | 7/1991 | Go Ang et al. | 326/87 |
| 5,063,308 | 11/1991 | Borkar | 326/87 |
| 5,081,374 | 1/1992 | Davis | 326/26 |
| 5,149,991 | 9/1992 | Rogers | 326/87 |
| 5,216,291 | 6/1993 | Seevinck et al. | 327/535 |
| 5,241,221 | 8/1993 | Fletcher et al. | 327/170 |
| 5,319,260 | 6/1994 | Wanlass | 326/26 |
| 5,489,861 | 2/1996 | Seymour | 327/108 |
| 5,559,447 | * 9/1996 | Rees | 326/87 |
| 5,570,044 | 10/1996 | Martin et al. | 326/84 |
| 5,604,453 | 2/1997 | Pedersen | 327/112 |
| 5,786,709 | 7/1998 | Kirsch et al. | 326/27 |
| 5,828,260 | 10/1998 | Taniguchi et al. | 327/387 |
| 5,877,647 | * 3/1999 | Vajapey et al. | 327/112 |
| 5,880,624 | * 3/1999 | Koyanagi et al. | 327/541 |
| 5,910,874 | 6/1999 | Iniewski et al. | 361/56 |

FOREIGN PATENT DOCUMENTS

| | | |
|---|---|---|
| 4-91515 | 3/1992 | (JP) . |
| 8-97693 | 4/1996 | (JP) . |

OTHER PUBLICATIONS

Furutani et al., "An Adjustable Output Driver with a Self–Recovering Vpp Generator for a 4M X 16 DRAM," IEEE Journal of Solid–State Circuits, vol. 29, No. 3, Mar. 1994, pp. 308–310.

Miyaji et al., "A 25–ns 4–Mbit CMOS SRAM with Dynamic Bit–Line Loads," IEEE Journal of Solid–State Circuits, vol., 24, No. 5, Oct. 1989, pp. 1213–1218.

Senthinathan et al., "Application Specific CMOS Output Driver Circuit Design Techniques to Reduce Simultaneous Switching Noise," IEEE, Journal of Solid–State Circuits, vol. 28, No. 12, Dec. 1993, pp. 1383–1388.

* cited by examiner

Primary Examiner—Terry D. Cunningham
Assistant Examiner—Long Nguyen
(74) Attorney, Agent, or Firm—Myers Bigel Sibley & Sajovec

(57) ABSTRACT

Load driving circuits are adjusted to drive loads with fewer or more pull-down devices by sensing the load electrically coupled to the load driving circuit. In particular, capacitance of the load is compared to a threshold capacitance. If the capacitance of the load is less than the threshold capacitance, selected ones of the pull-down devices are disabled, thereby reducing the capacity of the load driving circuit. If the capacitance of the load is greater than the threshold capacitance, selected ones of the pull-down devices are enabled, thereby increasing the capacity of the load driving circuit. The pull-down devices include delay circuits that enable selected transistors after a delay.

11 Claims, 5 Drawing Sheets

LOAD DRIVING CIRCUITS HAVING ADJUSTABLE OUTPUT DRIVE CAPABILITY

RELATED APPLICATION

This application is related to Korean Application No. 98-36292, filed Sep. 3, 1998, the disclosure of which is hereby incorporated herein by reference.

FIELD OF THE INVENTION

The present invention relates to integrated circuit devices in general and, more particularly, to load driving circuits.

BACKGROUND OF THE INVENTION

Load driving circuits, such as output buffers of an integrated circuit, may be used to drive large capacitive loads. Such output buffers may be relatively large to provide the capacity to drive large capacitive loads. For example, if a large capacity load is electrically coupled to the output, a large pull-down device may be able to pull-down the voltage level at the load faster than a smaller pull-down device.

Moreover, some conventional output buffers may be subject to noise when switching large loads and/or switching a large number of loads simultaneously. The noise can be generated by parasitic inductance of wires electrically coupled to the output. The noise generated by parasitic inductance of wires can combine with noise generated by the capacitance of the load to cause oscillations at the output of the buffer. Consequently, the output speed of the output buffer may be reduced and if the oscillation of the signal exceeds the noise margin of the output buffer circuit, the output buffer may malfunction.

FIG. 1 is a circuit diagram of a conventional output buffer. Referring to FIG. 1, the conventional output buffer includes a pull-up transistor 111, a pull-down transistor 112, and logic devices 113 through 117. The pull-up transistor 111 is electrically coupled to an external bus line via an output OUT. The pull-up transistor 111 pulls the voltage level at the output OUT up in response to a first output signal of the logic gate 114. The pull-down transistor 112 is electrically coupled to the output OUT and pulls the voltage level at the output OUT down in response to a second output signal of the logic gate 117. The pull-down transistor 112 can be large relative to the pull-up transistor 111. Reference designators DB and EN denote output data and an enable signal for the output buffer respectively.

In the case of a multi-bit semiconductor memory device, the problems described above can become more serious due to the simultaneous switching of outputs. Therefore, it may be beneficial to reduce the magnitude of the noise related to the switching speed of the output buffer by reducing the rate of change of the current.

It is known to apply a low voltage level to the gate of an NMOS transistor of the output buffer in an initial stage and apply a power supply voltage after a certain time has passed to reduce the rate of change of the current. Such techniques are discussed, for example, in an article by Miyaji, entitled *A 25ns 4Mbit CMOS SRAM with dynamic bit-line loads,* IEEE J. Solid-State Circuits, vol. 24, pp. 1213–1217, October 1989.

It is also known to provide an NMOS transistor and a PMOS transistor of the output buffer are comprised of N transistors electrically coupled in parallel and time taken to turn on the respective transistor is controlled. Such techniques are discussed, for example, in an article by Senthinathan entitled *Application specific CMOS output driver circuit design technique to reduce simultaneous switching noise,* in IEEE J. Solid-State Circuits, Vol. 28, pp. 1383–1388, December 1993. Unfortunately, according to the techniques discussed in Miyaji and Senthinathan, it may not be possible to know the load conditions in advance.

It is also known to control the output current of the output buffer by designating a slow mode and a fast mode from the outside according to the load condition of the output. Control of fast and slow modes is discussed, for example, in an article by Furutani entitled *Adjustable output driver with a self-recovering Vpp generator for a 4M×16 DRAM,* in IEEE J. Solid-State Circuits, Vol. 19, pp. 308–310, March 1994. Unfortunately, according to the techniques discussed in Furutani, additional pins may be needed on the device in order to designate the load condition external to the device.

SUMMARY OF THE INVENTION

It is therefore an object of the present invention to provide improved integrated circuit output buffers.

It is another object of the present invention to provide integrated circuit output buffers having improved simultaneous-switching noise characteristics.

These and other objects are provided by a buffer that includes a first and a second pull-down device therein electrically coupled in parallel between an output and a reference signal line. A load sensing circuit is electrically coupled to the output buffer and to the second pull-down device. The load sensing circuit disables the second pull-down device if a load capacitance, electrically coupled to the output of the buffer, is less than a threshold capacitance and enables the second pull-down device if the load capacitance is greater than the threshold capacitance. Accordingly, the enabled pull-down devices adjust the current driving capacity of the load driving circuit. Adjusting the current driving capacity can control the rate of change of the current conducted by the load driving circuit and, thereby, may reduce noise associated with driving the load.

In another aspect of the present invention, the load sensing circuit includes a reference capacitor and a comparator circuit that is electrically coupled to the first reference capacitor. The load sensing circuit generates a signal to enable the second pull-down device if the load capacitance is greater than the threshold capacitance.

In a further aspect of the present invention, the comparator circuit generates a signal to enable the second pull-down device if the load capacitance is greater than a reference capacitance of a reference capacitor value.

In yet another aspect of the present invention, the pull-down device includes first and second pull-down transistors and a delay circuit having an input electrically coupled to a gate electrode of the first pull-down transistor and an output electrically coupled to a gate electrode of the second pull-down transistor.

DESCRIPTION OF THE PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. It will be understood that when an element such as a circuit or transistor is referred to as "electrically coupled" another element, it can be directly connected to the other element or intervening elements may also be present. The present invention is described herein by reference to pull-down devices. It will be understood, however, that pull-up devices may also be used.

Figure 2:
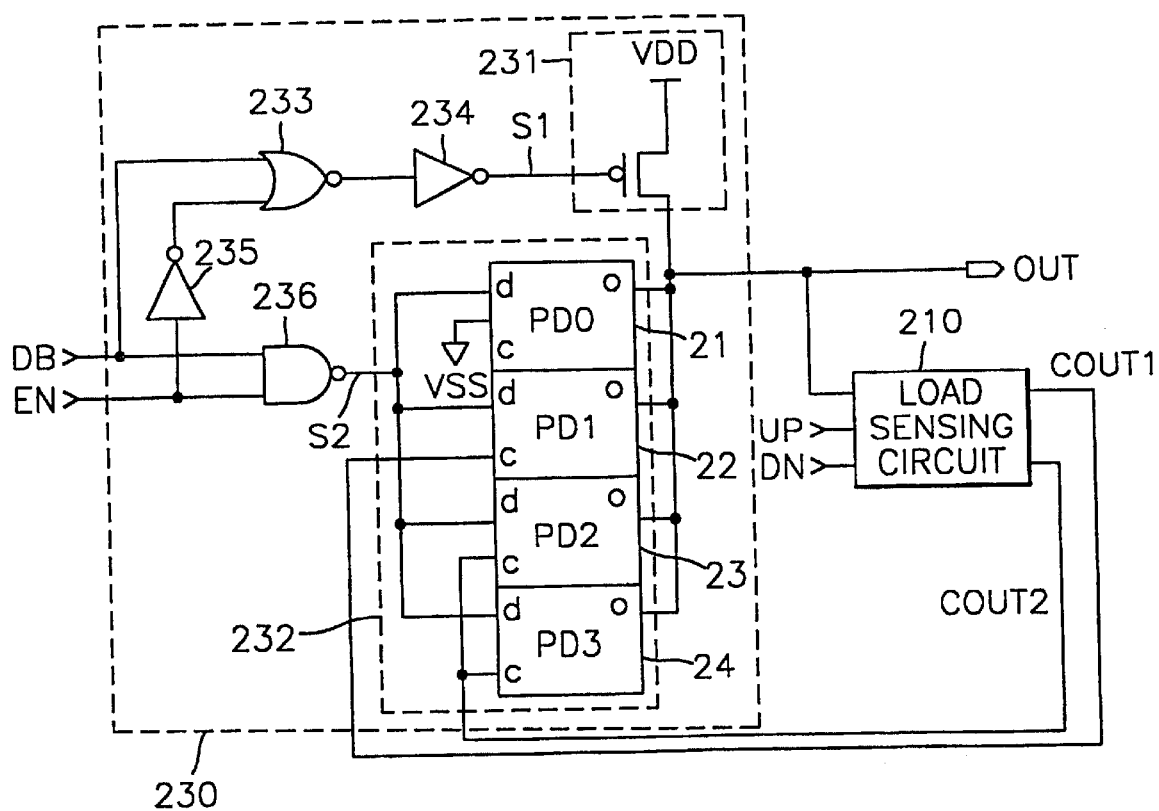
FIG. 2 is a circuit diagram of a load driving circuit according to the present invention.

Referring to FIG. 2, a load driving circuit according to the present invention includes a load sensing circuit 210 and a buffer 230. Reference designators DB and EN denote output data and an enable signal for the load driving circuit respectively. The load sensing circuit 210 senses the capacitive load electrically coupled to an output OUT of the buffer 230 and performs a comparison relative to a threshold capacitance. The load sensing circuit 210 enables and disables selected pull-down devices included in the buffer 230 in response to first and second enable signals COUT1, COUT2. Accordingly, the enabled or disabled pull-down devices adjust the driving capacity of the load driving circuit.

The load sensing circuit 210 disables selected ones of the pull-down devices if the load capacitance is less than a threshold capacitance and enables selected ones of the pull-down devices if the load capacitance is greater than the threshold capacitance. In particular, the first and second enable signals COUT1, COUT2 from the load sensing circuit 210 enable and disable the pull-down devices which change the size of the buffer 230. Accordingly, the driving capability of the load driving circuit can be adjusted.

The buffer 230 includes a pull-up device 231, a pull-down device 232, logic gates, i.e., a NOR gate 233 and a NAND gate 236, and inverters 234 and 235. The pull-up device 231 includes a PMOS transistor the drain of which is electrically coupled to the output. The pull-up device 231 pulls-up the output in response to a first output signal S1. The pull-down device 232 is electrically coupled to the output and pulls-down the output in response to a second output signal S2. The size of the pull-down device changes in response to the first and second enable signals COUT1, COUT2. Accordingly, the driving capability can be adjusted.

The pull-down device 232 includes a first pull-down device 21 electrically coupled to the output that is turned on or off in response to the second output signal S2, and a plurality of second pull down devices 22, 23, and 24 electrically coupled to the output which are turned on or turned off in response to the second output signal S2 and the first and second enable signals COUT1, COUT2. The second pull down device 22 is turned on or off in response to the second output signal S2 and the first enable signal COUT1. The second pull down devices 23 and 24 are turned on or off in response to the second output signal S2 and the second enable signal COUT2. As shown in FIG. 2, three pull-down devices are used to adjust the driving capacity of the load driving circuit. It will be understood, however, that more pull-down devices can be provided.

Figure 3:
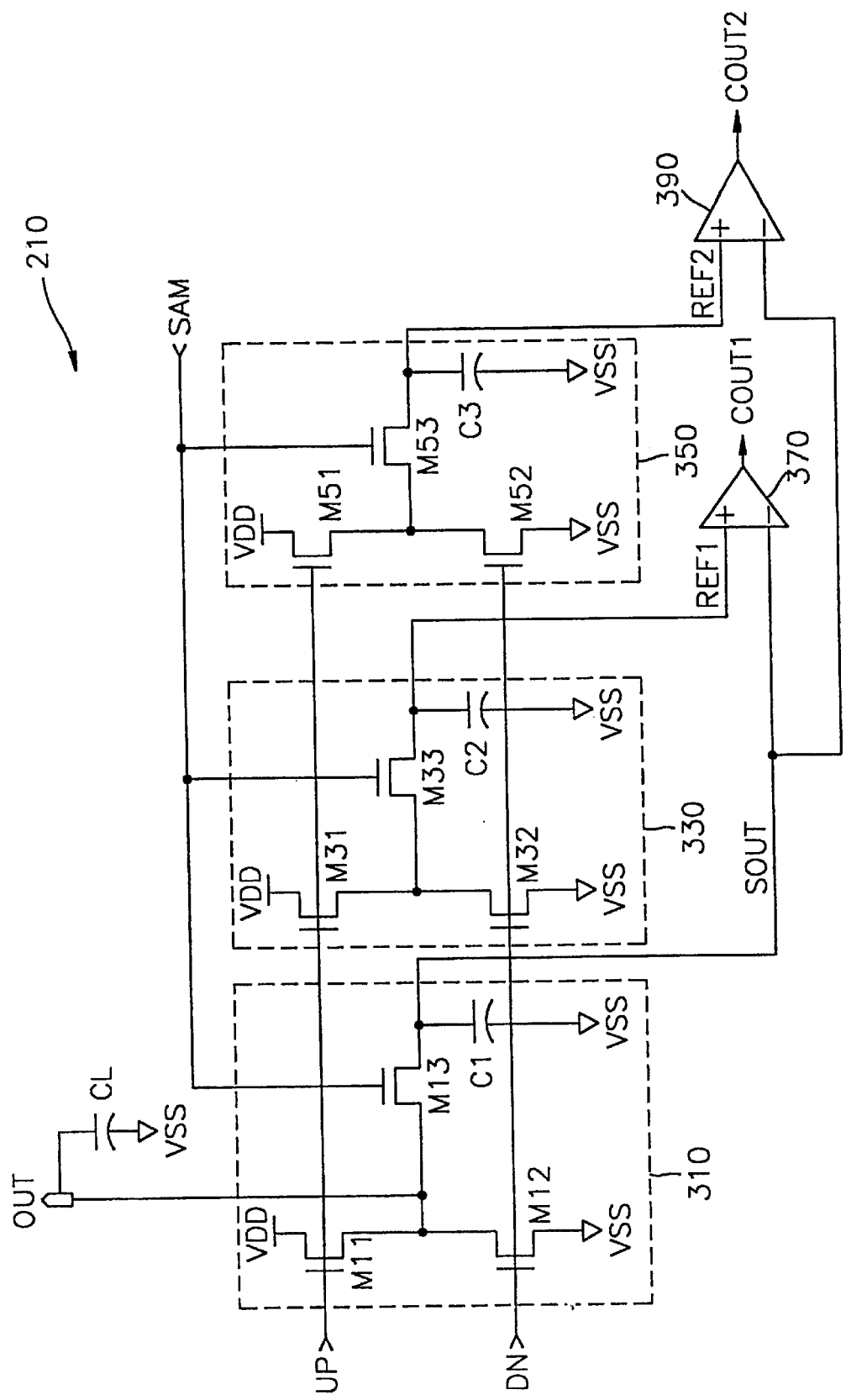
FIG. 3 is a detailed circuit diagram of a load sensing circuit shown in FIG. 2.

FIG. 3 is a detailed circuit diagram of the load sensing circuit 210 shown in FIG. 2. According to FIG. 3, the load sensing circuit 210 includes first and second reference capacitors C2, C3 the respective capacitance of which are different from that of a capacitive load, CL, that is electrically coupled to the output OUT. The load sensing circuit 210 also includes a load determining capacitor C1 that is used in combination with CL to provide a voltage level that is related to the value of CL. The reference capacitors are used to establish capacitance thresholds that are compared to the CL plus Cl. For example, if CL is less than the first reference capacitor C2, the first enable signal COUT1 disables the second pull-up device 22, but if CL is greater than the first reference capacitor C2, the first enable signal COUT1 enables the second pull-up device 22 thereby increasing the capacity of the load driving circuit in response to CL. If CL is more than the first reference capacitor C2 but less than the second reference capacitor C3, the second enable signal COUT2 disables the third and fourth pull-up devices 23, 24, and if CL is greater than the second reference capacitor C3, the second enable signal COUT2 enables the third and fourth pull-up devices 23, 24, thereby increasing the capacity of the load driving circuit in response to CL.

According to FIG. 3, the load sensing circuit 210 includes a load determining circuit 310, a first charging and discharging circuit 330, a second charging and discharging circuit 350, a first comparator 370, and a second comparator 390. The load determining circuit 310 includes first through third NMOS transistors M11, M12, and M13, and the load determining capacitor C1. The load determining capacitor C1 is charged by applying a predetermined voltage, i.e., a power supply voltage VDD, in response to a charge signal UP and a charge/discharge control signal SAM. The charge on the load determining capacitor C1 is discharged for a predetermined time interval in response to the discharge signal DN and the charge/discharge control signal SAM.

The first NMOS transistor M11 includes a drain to which the power supply voltage VDD is applied, a gate to which the charge signal UP is applied, and a source electrically coupled to the output OUT. The second NMOS transistor M12 includes a drain electrically coupled to the output OUT, a gate to which the discharge signal DN is applied, and a source to which the ground voltage VSS is applied. The third NMOS transistor M13 is a pass transistor that allows the first or second NMOS transistors M11, M12 to be electrically coupled to the load determining capacitor C1. The third NMOS transistor M13 includes a drain electrically coupled to the output OUT and a gate to which the charge/discharge control signal SAM is applied. A first signal line SOUT, electrically coupled to a first terminal of the load determining capacitor Cl, is electrically coupled to the source of the third NMOS transistor M13 and a second terminal of the load determining capacitor C1 is electrically coupled to the ground voltage VSS.

The first charging and discharging circuit 330 comprises fourth through sixth NMOS transistors M31, M32, and M33, and the first reference capacitor C2, charges the first reference capacitor C2 by applying the power supply voltage VDD in response to the charge signal UP and the charge/discharge control signal SAM and discharges the charge on the first reference capacitor C2 for a predetermined time interval in response to the discharge signal DN and the charge/discharge control signal SAM.

The fourth NMOS transistor M31 includes a drain to which the power supply voltage VDD is applied and a gate to which the charge signal UP is applied. The fifth NMOS transistor M32 includes a drain electrically coupled to the source of the fourth NMOS transistor M31, a gate to which the discharge signal DN is applied, and a source to which the ground voltage VSS is applied. The sixth NMOS transistor M33 is a pass transistor that allows the first or second NMOS transistors M31, M32 to be electrically coupled to the first reference capacitor C2. The sixth NMOS transistor M33 includes a drain electrically coupled to the source of the fourth NMOS transistor M31 and a gate to which the charge/discharge control signal SAM is applied. A signal line REF electrically couples a first terminal of the first reference capacitor C2 to the source of the sixth NMOS transistor M33. A second terminal of the first reference capacitor C2 is electrically coupled to the ground voltage VSS.

The second charging and discharging circuit 350 comprises seventh through ninth NMOS transistors M51, M52, and M53, and a second reference capacitor C3. The second charging and discharging circuit 350 charges the second reference capacitor C3 by applying the power supply voltage VDD in response to the charge signal UP and the charge/discharge control signal SAM and discharges the charge on the second reference capacitor C3 for a predetermined time interval in response to the discharge signal DN and the charge/discharge control signal SAM.

The seventh NMOS transistor M51 includes a drain to which the power supply voltage VDD is applied and a gate to which the charge signal UP is applied. The eighth NMOS transistor M52 includes a drain electrically coupled to the source of the seventh NMOS transistor M51, a gate to which the discharge signal DN is applied, and a source to which the ground voltage VSS is applied. The ninth NMOS transistor M53 is a pass transistor that allows the first or second NMOS transistors M51, M52 to be electrically coupled to the second reference capacitor C3. The ninth NMOS transistor M53 includes a drain electrically coupled to the source of the seventh NMOS transistor M51 and a gate to which the charge/discharge control signal SAM is applied. A signal line REF2 electrically couples the second reference capacitor C3 to the source of the ninth NMOS transistor M53 and a second terminal of the second reference capacitor C3 is electrically coupled to the ground voltage VSS. The sizes of the NMOS transistors M12, M32, and M52 can be the same.

As shown in FIG. 3, the load sensing circuit 210 includes three capacitors C1, C2, and C3 having different capacitance values. The capacitance of the load determining capacitor C1 is less than CL. The capacitance of the first reference capacitor C2 is less than the capacitance of the second reference capacitor C3. It will be understood however, that more than three capacitors having different capacities may be included in the load sensing circuit 210 to provide respective capacitive thresholds.

Referring to FIG. 3, the first comparator 370 compares the voltage level across the load determining capacitor C1 (i.e., the voltage level present on SOUT of the load determining capacitor C1) with the voltage level across the first reference capacitor C2 (i.e., the voltage level present on REF1 of the first reference capacitor C2) and outputs the result as the first enable signal COUT1 to the pull-down device 232.

The second comparator 390 compares the voltage level across the load determining capacitor C1 (i.e., the voltage level present on SOUT of the load determining capacitor C1) to the voltage level across the second reference capacitor C3 (i.e., the voltage level present on REF2 from the second reference capacitor C3) and outputs the result as the second enable signal COUT2 to the pull-down device 232.

Figure 4:
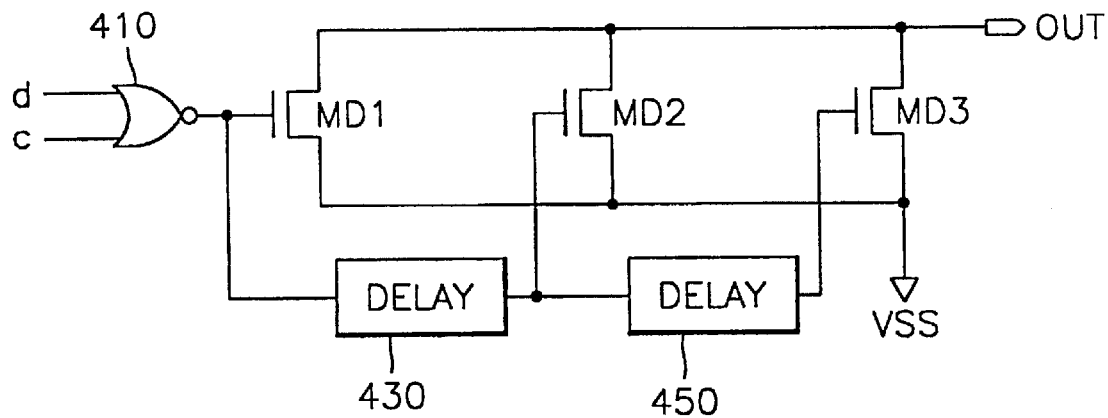
FIG. 4 is a detailed circuit diagram of pull-down devices shown in FIG. 2.

FIG. 4 is a detailed circuit diagram of the pull-down device shown in FIG. 2. The pull-down device includes a NOR gate 410 that receives the second output signal S2 shown in FIG. 2 as a first input signal d and receives the first or second enable signal COUT1, COUT2 from the load sensing circuit 210 as a second input signal c. The pull-down device also includes a plurality of pull-down transistors MD1, MD2, and MD3 electrically coupled in parallel between the output OUT and the ground VSS. According to FIG. 4, three pull-down transistors are used. It will be understood however, that more than three pull-down transistors can be provided.

A first delay circuit 430 is electrically coupled between the output of the NOR gate 410 and the gate of the pull-down transistor MD2. A second delay circuit 450 can also be electrically coupled between the output of the delay circuit 430 and the gate of the pull-down transistor MD3. According to the present invention, the first and second delay circuits 430, 450 can reduce the rate of change of the driving current conducted.

Figure 5:
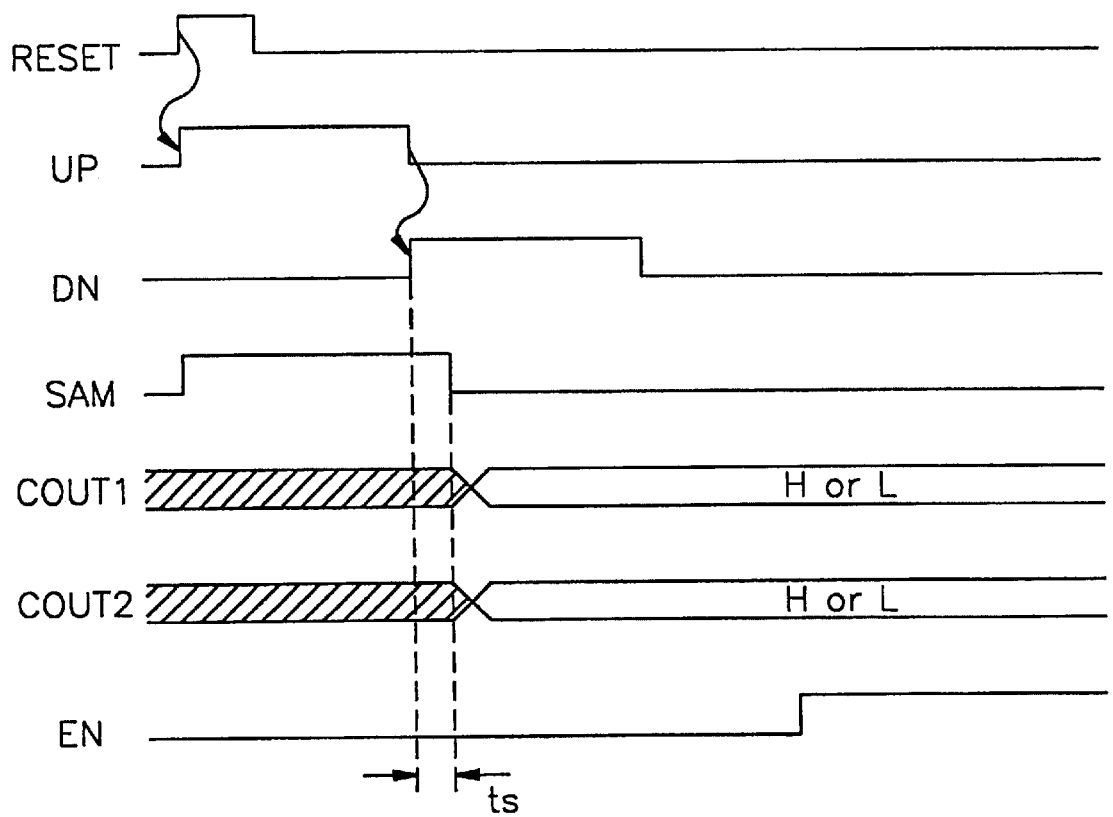
FIG. 5 is a timing diagram that illustrates operations of the load driving circuit of FIG. 2.

FIG. 5 is a timing diagram that illustrates operations of the load driving circuit according to the present invention. When a reset signal RESET becomes a logic high in an initial stage of the operation, the charge signal UP becomes a logic high. Accordingly, the NMOS transistors M11, M31, and M51 of the load sensing circuit shown in FIG. 3 are turned on.

The charge/discharge control signal SAM becomes a logic high whereupon the NMOS transistors M13, M33, and M53 of the load sensing circuit 210 are turned on so that the load determining capacitor C1 and the first and second reference capacitors C2, C3 are charged by the power supply voltage VDD.

Later, the charge signal UP becomes a logic low and the discharge signal DN becomes a logic high whereupon the NMOS transistors M11, M31, and M51 of the load sensing circuit 210 are turned off and the NMOS transistors M12, M32, and M52 are turned on. Accordingly, the load determining capacitor C1 and the first and second reference capacitors C2, C3 are discharged for a predetermined time interval ts (i.e., for the time taken for the charge/discharge control signal SAM to become a logic low). Therefore, after the charge/discharge control signal SAM becomes a logic low, the load determining circuit C1 and the first and second reference capacitors C2, C3 stop discharging and hold the remaining charge.

A respective voltage level is maintained on each of the signal lines SOUT, REF1, and REF2 of the load determining capacitor C1 and the first and second reference capacitors C2, C3. Since the load determining capacitor C1 is electrically coupled in parallel to the load capacitor CL of the output OUT, the charging and discharging of the load determining capacitor C1 is performed together with the charging and discharging of the load capacitor CL.

When the capacitance of the load capacitor CL of the output OUT is less than the capacitance of the first reference capacitor C2, the voltage level on the signal line SOUT of the load determining capacitor C1 is less than the voltage level on the signal line REF1 of the first reference capacitor C2. Also, since the capacitance of the first reference capacitor C2 is less than the capacitance of the second reference capacitor C3, the voltage level on the signal line SOUT of the load determining capacitor C1 is less than the voltage level on the signal line REF2 of the second reference capacitor C3. Accordingly, the first enable signal COUT1 of the first comparator 370 and the second enable signal COUT2 of the second comparator 390 becomes a logic high. As a result, the second pull-down devices 22, 23, and 24 shown in FIG. 2 are turned off. Therefore, when the capacitance of the load capacitor CL of the output OUT is less than the capacitance of the first reference capacitor C2, the driving capability of the load driving circuit is determined by the first pull-down device 21 shown in FIG. 2.

When the capacitance of the load CL is greater than the value of the first reference capacitor C2 and less than the value of the second reference capacitor C3, the voltage level on the signal line SOUT of the load determining capacitor C1 is greater than the voltage level on the signal line REF1 of the first reference capacitor C2 and lower than the voltage level on the signal line REF2 of the second reference capacitor C3. Accordingly, the first enable signal COUT1 provided by the first comparator 370 becomes a logic low and the second enable signal COUT2 of the second comparator 390 becomes a logic high. As a result, the second pull down devices 23, 24 shown in FIG. 2 are turned off. Therefore, when the capacitance of the load CL is greater than the value of the first reference capacitor C2 and less than the value of the second reference capacitor C3, the driving capability of the output buffer according to the present invention is detennined by the first and second pull-down devices 21 and 22 shown in FIG. 2.

When the capacitance of the load CL is larger than the value of the second reference capacitor C3, the voltage level on the signal line SOUT of the load determining capacitor C1 becomes greater than the voltage level on the signal line REFI of the first reference capacitor C2 and the voltage level on the signal line REF2 of the second reference capacitor C3. Accordingly, the first enable signal COUT1 of the first comparator 370 and the second enable signal COUT2 of the second comparator 390 becomes a logic low. As a result, the second pull down devices 22, 23, and 24 shown in FIG. 2 are turned on or turned off in response to the second output signal S2. Therefore, when the capacitance of the load CL is greater than the value of the second reference capacitor C3, the driving capability of the load driving circuit is determined by the first pull-down device 21 and the second pull down devices 22, 23, and 24, shown in FIG. 2.

Figure 1:
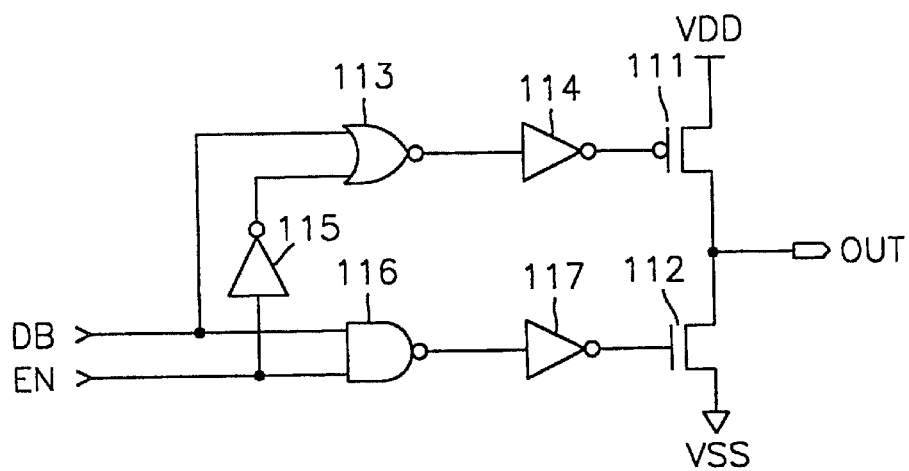
FIG. 1 is a circuit diagram of a conventional output buffer.
Figure 6A:
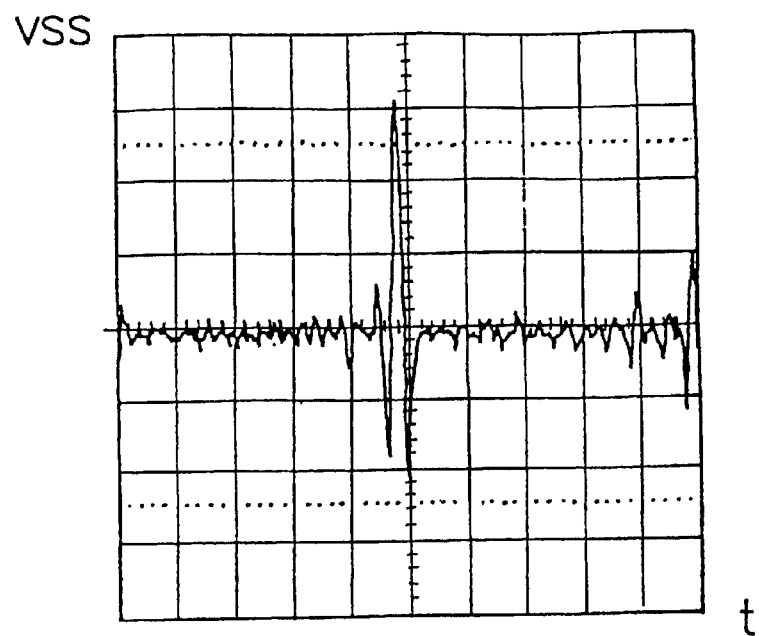
FIG. 6A is an exemplary waveform of the ground VSS noise of a conventional load driving circuit shown in FIG. 1 when the load on an output is about 10pF.
Figure 6B:
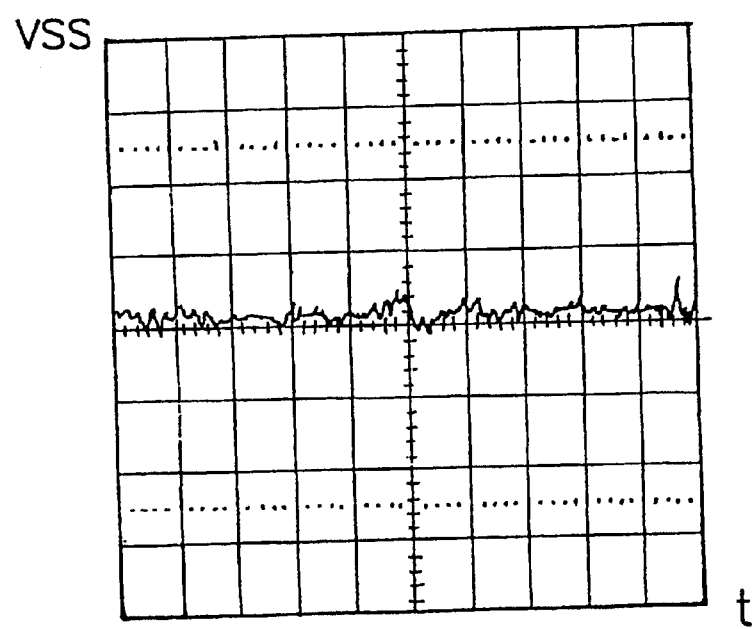
FIG. 6B is an exemplary waveform of the ground VSS noise of a load driving circuit according to the present invention shown in FIG. 2 when the load on the output is about 10pF.

FIG. 6A is an exemplary waveform of the ground voltage VSS of the conventional output buffer shown in FIG. 1 when the load of the output port is about 10pF. FIG. 6B is an exemplary waveform of the ground voltage VSS of the load driving circuit according to the present invention shown in FIG. 2 when the load of the output port is about 10pF.

Figure 7A:
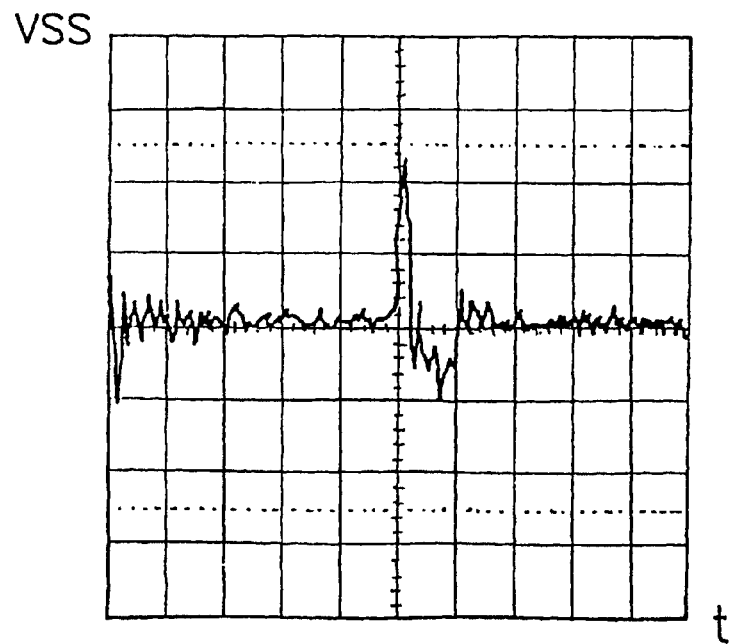
FIG. 7A is an exemplary waveform of the ground VSS noise of the conventional load driving circuit shown in FIG. 1 when the load on the output is about 100PF.
Figure 7B:
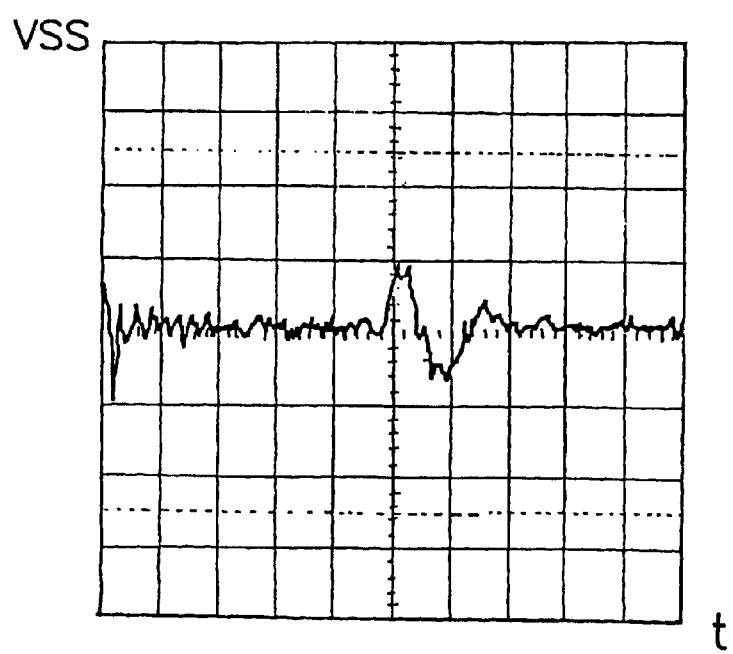
FIG. 7B is an exemplary waveform of the ground VSS noise of the output buffer according to the present invention shown in FIG. 2 when the load on the output is about 100pF.

FIG. 7A is an exemplary waveform of the ground voltage VSS of the conventional output buffer shown in FIG. 1 when the load of the output port is about 100 PF. FIG. 7B is a exemplary waveform of the ground voltage VSS of the load driving circuit according to the present invention shown in FIG. 2.

Therefore, in a load driving circuit according to the present invention, current driving capability can be adjusted by sensing an external load condition, i.e., the load electri-cally coupled to an output. Adjusting the current driving capability can control the rate of change of the current conducted by the of the load driving circuit and, thereby, may reduce noise associated with driving the load.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A load driving circuit comprising:
   a buffer including a pull-down device therein electrically coupled between an output thereof and a reference signal line;
   a load sensing circuit that is electrically coupled to the output of the buffer and to the pull-down device, that enables and disables the pull-down device based on a comparison of a load capacitance at the output and a threshold capacitance; and
   wherein the load sensing circuit comprises:
      a reference capacitor having the threshold capacitance; and
      a comparator circuit that is electrically coupled to the reference capacitor and generates a signal to enable the pull-down device if the load capacitance is greater than the threshold capacitance.

2. A load driving circuit comprising:
   a buffer including first and second pull-down devices therein electrically coupled in parallel between an output thereof and a reference signal line;
   a load sensing circuit that is electrically coupled to the output of the buffer and to the second pull-down device, disables the second pull-down device if a load capacitance electrically coupled to the output of the buffer is less than a first threshold capacitance and enables the second pull-down device if the load capacitance is greater than the first threshold capacitance:
   wherein the first pull-down device comprises:
      a first pull-down transistor that is electrically coupled to the output of the buffer;
      a second pull-down transistor that is electrically coupled to the output of the buffer; and
      a delay circuit having an input electrically coupled to a gate electrode of the first pulldown transistor and an output electrically coupled to a gate electrode of the second pull-down transistor, wherein the input receives an input signal to the buffer.

3. A load driving circuit comprising:
   a buffer including first and second pull-down devices therein electrically coupled in parallel between an output thereof and a reference signal line;
   a load sensing circuit that is electrically coupled to the output of the buffer and to the second pull-down device, disables the second pull-down device if a load capacitance electrically coupled to the output of the buffer is less than a first threshold capacitance and enables the second pull-down device if the load capacitance is greater than the first threshold capacitance;
   wherein the second pull-down device comprises:
      a first pull-down transistor that is electrically coupled to the output of the buffer;
      a second pull-down transistor that is electrically coupled to the output of the buffer; and
      a delay circuit having an input electrically coupled to a gate electrode of the first pulldown transistor and an output electrically coupled to a gate electrode of the second pull-down transistor, wherein the input receives an input signal to the buffer in response to an output from the load sensing circuit.

4. A load driving circuit comprising:
a buffer including first and second pull-down devices therein electrically coupled in parallel between an output thereof and a reference signal line;
a load sensing circuit that is electrically coupled to the output of the buffer and to the second pull-down device, disables the second pull-down device if a load capacitance electrically coupled to the output of the buffer is less than a first threshold capacitance and enables the second pull-down device if the load capacitance is greater than the first threshold capacitance;
wherein the buffer further comprises:
a third pull-down device electrically coupled in parallel with the first and second pull-down devices; and
wherein the load sensing circuit disables the third pull-down device if the load capacitance is less than a second threshold capacitance and enables the third pull-down device if the load capacitance is greater than the second threshold capacitance.

5. The load driving circuit of claim 4, wherein the second threshold capacitance is greater than the first threshold capacitance.

6. The load driving circuit of claim 4, wherein the buffer further comprises:
a fourth pull-down device electrically coupled in parallel with the first through third pull-down devices; and
wherein the load sensing circuit is electrically coupled to the fourth pull-down device and disables the fourth pull-down device if the load capacitance is less than the second threshold capacitance and enables the fourth pull-down device if the load capacitance is greater than the second threshold capacitance.

7. A load driving circuit comprising:
a buffer including a pull-down device therein electrically coupled between an output thereof and a reference signal line;
a load sensing circuit that is electrically coupled to the output of the buffer and to the pull-down device, that enables and disables the pull-down device based on a comparison of a load capacitance at the output and a threshold capacitance; and
wherein the load sensing circuit comprises:
a load capacitance circuit that is electrically coupled to the output of the buffer and provides a load capacitance voltage level corresponding to the load capacitance;
a first threshold capacitance circuit that includes a first threshold capacitor and provides a first threshold capacitance voltage level across the first threshold capacitor; and
a first comparator that is electrically coupled to the load capacitance circuit and the first threshold capacitance circuit and compares the load capacitance voltage level to the first threshold capacitance voltage level to provide a first enable signal to the pull-down device if the load capacitance is greater than the first threshold capacitance.

8. The load driving circuit of claim 7, wherein the load sensing circuit further comprises:
a second threshold capacitance circuit that includes a second threshold capacitor and provides a second threshold capacitance voltage level across the second threshold capacitor; and
a second comparator, electrically coupled to the load capacitance circuit and the second threshold capacitance circuit, wherein the second comparator compares the load capacitance voltage level to the second threshold capacitance voltage level to provide a second enable signal to the third pull-down device if the load capacitance is greater than the second threshold capacitance.

9. The load driving circuit of claim 7, wherein the first threshold capacitance circuit comprises:
a charging circuit that charges the first threshold capacitor to a charge voltage level by applying a predetermined voltage level thereto in response to a charge signal; and
a discharging circuit that discharges the charge voltage level across the first threshold capacitor for a predetermined time interval to the first threshold capacitance voltage level in response to a discharge signal.

10. The load driving circuit of claim 7, wherein the load capacitance circuit comprises:
a load determining capacitor that is electrically coupled to the output;
a charging circuit that charges the load determining capacitor to a charge voltage level by applying a predetermined voltage level thereto in response to a charge signal; and
a discharging circuit that discharges the charge voltage level across the load determining capacitor for a predetermined time interval to the load capacitance voltage level in response to a discharge signal.

11. The load driving circuit of claim 9, wherein the charging and discharging circuits comprise:
a first NMOS transistor including a first drain coupled to the first reference signal line, a first gate coupled to the charge signal, and a first source electrically coupled to the output;
a second NMOS transistor including a second drain electrically coupled to the output, a second gate electrically coupled to the discharge signal, and a second source coupled to the second reference signal line; and
a third NMOS transistor including a third drain electrically coupled to the output and a third gate coupled to a charge/discharge control signal, wherein a first terminal of the load capacitor is electrically coupled to a third source of the third NMOS transistor and a second terminal of the load capacitor is coupled to the second reference signal line.

* * * * *